(12) United States Patent
Wang (10) Patent No.: US 10,896,856 B2
(45) Date of Patent: Jan. 19, 2021

(54) SEMICONDUCTOR STRUCTURES, STATIC RANDOM ACCESS MEMORIES, AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 91 days.

(21) Appl. No.: 16/290,108

(22) Filed: Mar. 1, 2019

(65) Prior Publication Data
US 2019/0304844 A1 Oct. 3, 2019

(30) Foreign Application Priority Data

Mar. 30, 2018 (CN) .......................... 2018 1 0278048

(51) Int. Cl.
*H01L 21/8234* (2006.01)
*H01L 21/266* (2006.01)
*H01L 21/308* (2006.01)
*H01L 21/225* (2006.01)
*H01L 29/78* (2006.01)
*H01L 21/768* (2006.01)
*H01L 27/11* (2006.01)
*H01L 29/06* (2006.01)

(52) U.S. Cl.
CPC .. *H01L 21/823481* (2013.01); *H01L 21/2253* (2013.01); *H01L 21/266* (2013.01); *H01L 21/3086* (2013.01); *H01L 21/76897* (2013.01); *H01L 21/823431* (2013.01); *H01L 21/823437* (2013.01); *H01L 27/1108* (2013.01); *H01L 29/0649* (2013.01); *H01L 29/7851* (2013.01)

(58) Field of Classification Search
CPC .................................................. H01L 21/8234
See application file for complete search history.

*Primary Examiner* — Marvin Payen
(74) *Attorney, Agent, or Firm* — Anova Law Group, PLLC (57) ABSTRACT

A method for fabricating a semiconductor structure includes providing a base substrate; and forming two first fin structures and an initial isolation structure. The initial isolation structure includes a first region, located between the two first fin structures, and two second regions, each separated from the first region by a first fin structure. The method includes implanting doping ions into the initial isolation structure in the first region; and forming an isolation structure by removing a portion of the initial isolation structure. The removal rate of the initial isolation structure formed in the first region is smaller than the removal rate of the initial isolation structure formed in the two second regions. The top surface of the isolation structure is higher in the first region than in the two second regions. The method further includes forming a plurality of source/drain openings by removing a portion of the first fin structures.

13 Claims, 5 Drawing Sheets

SEMICONDUCTOR STRUCTURES, STATIC RANDOM ACCESS MEMORIES, AND FABRICATION METHODS THEREOF

CROSS-REFERENCES TO RELATED APPLICATIONS

This application claims the priority of Chinese Patent Application No. CN201810278048.7, filed on Mar. 30, 2018, the entire content of which is incorporated herein by reference.

FIELD OF THE DISCLOSURE

The present disclosure generally relates to the field of semiconductor fabrication technology and, more particularly, relates to semiconductor structures, static random access memories (SRAMs), and fabrication methods thereof.

BACKGROUND

With the continuous development of digital integrated circuits (ICs), on-chip integrated memory have become an important part of digital systems. Static random access memory (SRAM) is an indispensable part of on-chip memory because of the low power consumption and high speed. As long as it is powered, SRAM is able to store data without constantly refreshing itself.

A basic SRAM usually includes six transistors: two pull-up (PU) transistors, two pull-down (PD) transistors, and two pass-gate (PG) transistors. In a write process of an SRAM, it usually needs to ensure a sufficiently large β ratio (current ratio: $I_{pd}/I_{pg}$) to obtain a sufficiently high static-noise margin (SNM). In the meantime, it also needs to have a sufficiently large γ ratio (current ratio: $I_{pg}/I_{pu}$) to achieve desired writability. Therefore, the different requirements on the performance of the PG transistors lead to a conflict between the writability and the read stability of the SRAM.

The performance of SRAMs formed by existing technology may need to be improved. The disclosed semiconductor structures, SRAMs, and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a base substrate; and forming two first fin structures and an initial isolation structure on the base substrate. The two first fin structures are parallel to each other, and the top surface of the initial isolation structure is lower than the top surfaces of the two first fin structures. The initial isolation structure includes a first region, located between the two first fin structures, and two second regions, each being in contact with a first fin structure and located on one side of the first fin structure in opposite to the first region. The method also includes implanting doping ions into the top of the initial isolation structure formed in the first region adjacent to the two first fin structures; and forming an isolation structure by removing a portion of the initial isolation structure. The removal rate of the initial isolation structure formed in the first region adjacent to the two first fin structures is smaller than the removal rate of the initial isolation structure formed in the two second regions adjacent to the two first fin structures. The top surface of the isolation structure formed in the first region adjacent to the two first fin structures is higher than the top surface of the isolation structure formed in the two second regions. The method further includes forming a plurality of source/drain openings in the isolation structure by removing a portion of the two first fin structures.

Another aspect of the present disclosure provides a semiconductor structure. The semiconductor structure includes a base substrate; and two first fin structures formed on the base substrate. The two first fin structures are parallel to each other. The semiconductor structure also includes an isolation structure formed on the base substrate. The top surface of the isolation structure is lower than the top surfaces of the two first fin structures. The isolation structure covers a portion of sidewall surfaces of the two first fin structures. The isolation structure includes a first region, located between the two first fin structures, and two second regions, each being in contact with a first fin structure and located on one side of the first fin structure in opposite to the first region. The top surface of the isolation structure formed in the first region adjacent to the two first fin structures is higher than the top surface of the isolation structure formed in the two second regions. The semiconductor structure further includes a plurality of source/drain openings formed in the first fin structures and having a bottom surface lower than the top surface of the isolation structure formed in the two second regions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
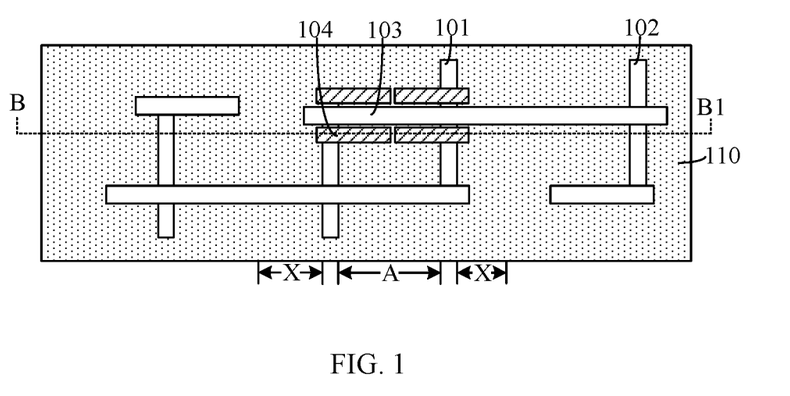
FIGS. 1-2 illustrate schematic cross-sectional views of a static random access memory (SRAM)
Figure 2:
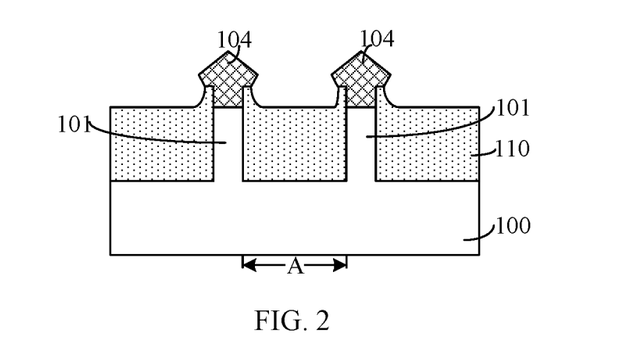

FIGS. 1-2 illustrate schematic views of a static random access memory (SRAM). Specifically, FIG. 1 illustrates a schematic top view of the SRAM, and FIG. 2 illustrates a schematic cross-sectional view of a portion of the SRAM shown in FIG. 1 along a B-B1 line.

Referring to FIGS. 1 and 2, according to the fabrication method, a base substrate 100 is provided. Further, a plurality of first fin structures 101 and an isolation structure 110 are formed on the surface of the base substrate 100. The top surface of the isolation structure 110 is lower than the top surfaces of the plurality of first fin structures 101. The isolation structure 110 also covers a portion of the sidewall surfaces of each first fin structure 101. The isolation structure 110 includes a first region A between adjacent first fin structures 101 and two second regions X located on the two opposite sides of the first region A. Moreover, a first gate structure 103 is formed across the first fin structures 101, and a first source/drain doped region 104 is formed in each first fin structure 101 on the two sides of the first gate structure 103.

According to the method described above, as the integration degree of the SRAM increases, the size of the first region A in the width direction of the first fin structures 101 continuously decreases. Because a portion of the first source/drain doped region 104 may extend from the corresponding first fin structure 101 into the first region A, the first source/drain doped regions 104 formed in adjacent first fin structures 101 may still likely contact each other, which is adverse to improving the performance of the SRAM.

A method of reducing the contact between adjacent first source/drain doped regions 104 includes reducing the dimension of the first source/drain doped region 104 located in the first region A along the width direction of the first fin structure 101. For example, the method for forming the first source/drain doped region 104 includes: removing a portion of the first fin structure 101 to form a first source/drain opening. The bottom of the first source/drain opening is lower than the top surface of the isolation structure. The isolation structure 110 is used to limit (e.g., define) the topography of the first source/drain doped region 104, such that the dimension of the first source/drain doped region 104 along the width direction of the first fin structure 101 is small. As such, adjacent first source/drain doped regions 104 may unlikely contact each other.

However, the method for forming the isolation structure 110 includes forming an isolation material film on the surface of the base substrate 100 and also on the sidewall and top surfaces of each first fin structure 101; and removing a portion of the isolation material film to form the isolation structure 110. The isolation material film is made of a material including silicon oxide, and formed through a process including chemical vapor deposition (CVD). By forming the isolation material layer through a CVD process, the variation in the thickness of the isolation material layer in the first region A and the second region X is small. That is, the portion of the isolation structure 110 formed on the sidewall surface of the first fin structure 101 in the first region A and the portion of the isolation structure 110 formed on the sidewall surface of the first fin structure 101 in the second region X demonstrate similar effect in limiting (e.g., defining) the first source/drain doped region 104. When the portion of the isolation structure 110 formed in the first region A and on the sidewall surface of the first fin structure 101 strictly limits (e.g., defines) the first source/drain doped region 104, the insulation structure 110 formed in the second region X and on the sidewall surface of the first fin structure 101 is also able to strictly limit (e.g., define) the first source/drain doped region 104. Therefore, the dimension of the first source/drain doped region 104 in a direction along the width direction of the first fin structure 101 is small. As such, when a plug is formed on the top of the first source/drain doped region 104 in a subsequent process, the contact area between the plug and the first source/drain doped region 104 may be small, so that the contact resistance between the plug and the first source/drain doped region 104 may be large, which may not be conducive to improving the performance of the fin structures of the SRAM.

Figure 10:
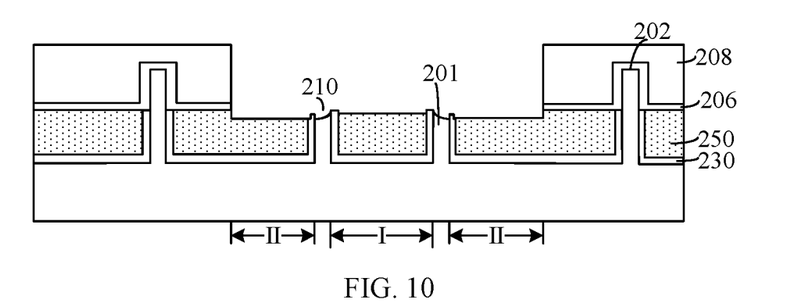
Figure 11:
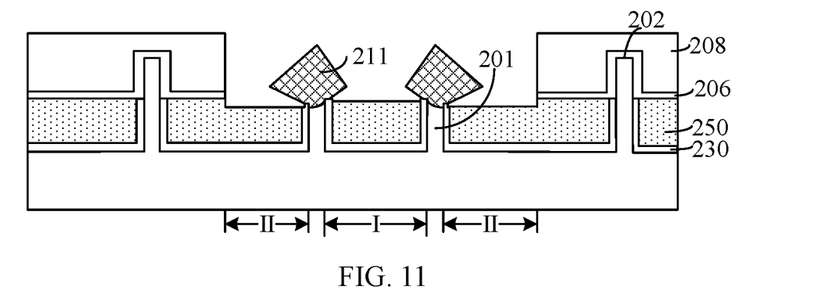
Figure 12:
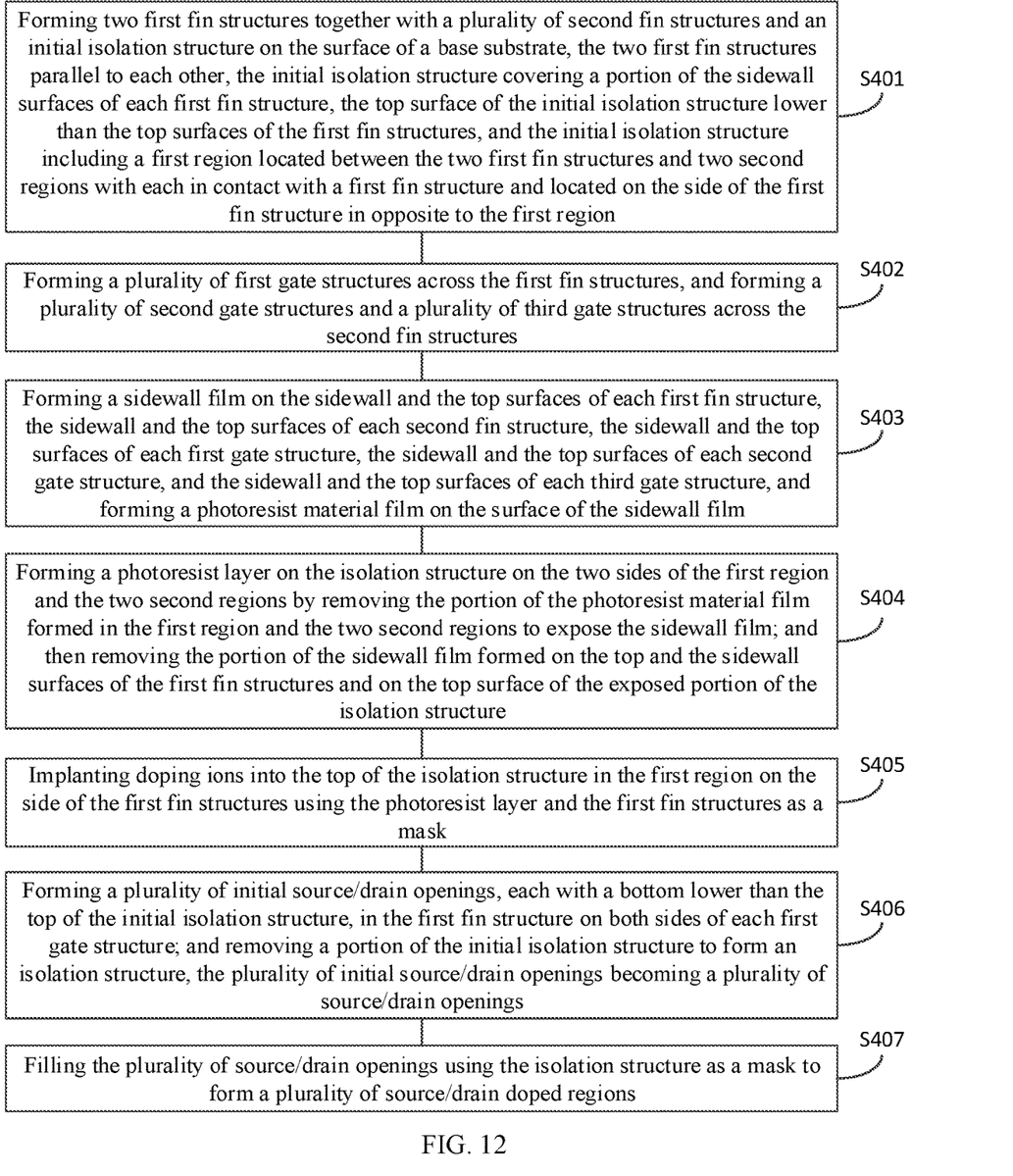
FIG. 12 illustrates a flowchart of an exemplary method for fabricating a semiconductor device consistent with various embodiments of the present disclosure.

The present disclosure provides a method for forming semiconductor structures with improved performance. FIG. 12 illustrates a flowchart of an exemplary method for fabricating a semiconductor device consistent with various embodiments of the present disclosure. FIGS. 3-11 illustrate schematic views of structures at certain stages of the exemplary fabrication method.

Figure 3:
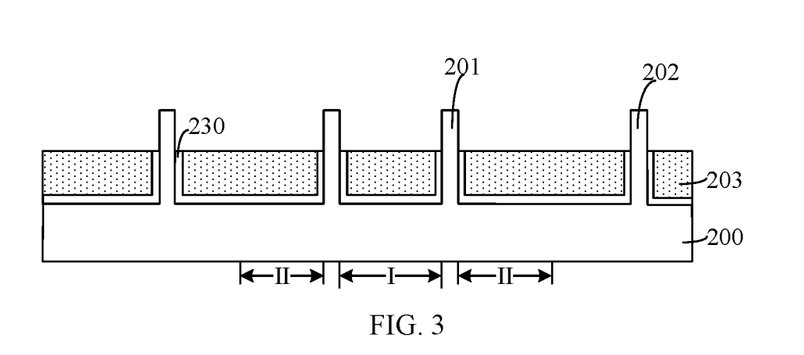
FIGS. 3-11 illustrate schematic views of structures at certain stages of an exemplary method for fabricating a semiconductor structure consistent with some embodiments of the present disclosure.
Figure 4:
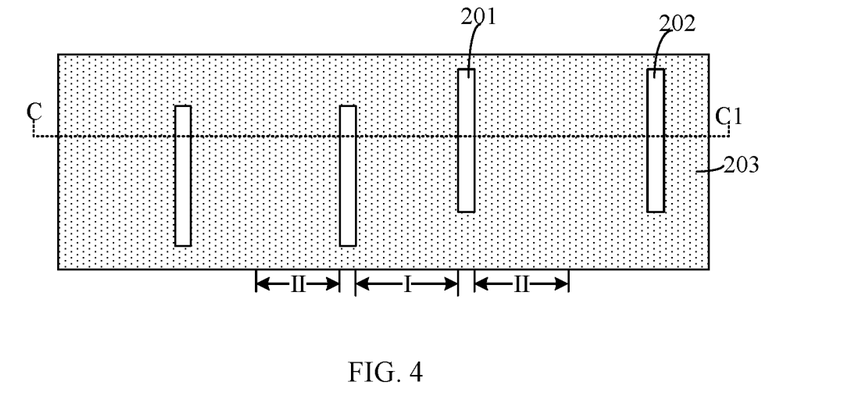

Referring to FIG. 12, two first fin structures, together with a plurality of second fin structures and an initial isolation structure, may be formed on the surface of a base substrate; the two first fin structures may be parallel to each other; the initial isolation structure may cover a portion of the sidewall surfaces of each first fin structure; the top surface of the initial isolation structure may be lower than the top surfaces of the first fin structures; and the initial isolation structure may include a first region located between the two first fin structures and two second regions with each being in contact with a first fin structure and located on the side of the first fin structure in opposite to the first region (S401). FIGS. 3-4 illustrate schematic views of an exemplary structure consistent with various embodiments of the present disclosure. Specifically, FIG. 4 illustrates a schematic top view of the structure, and FIG. 3 illustrates a schematic cross-sectional view of the structure shown in FIG. 4 along a C-C1 line.

Referring to FIGS. 3-4, a base substrate 200 may be provided. Two first fin structures 201 and an initial isolation structure 203 may be formed on the surface of the base substrate 200. The two first fin structures 201 may be arranged parallel to each other. The initial isolation structure 203 may cover a portion of the sidewall surfaces of each first fin structure 201, and the top surface of the initial isolation structure 203 may be lower than the top surfaces of the two first fin structures 201. The initial isolation structure 203 may include a first region I and two second regions II. The first region I may be in contact with both first fin structures 201, and thus may be located between the two first fin structures 201. Each second region II may be in contact with a first fin structure 201 and located on the side of the first fin structure 201 in opposite to the first region I.

In one embodiment, the base substrate 200 may be used to form an SRAM, and accordingly, the first fin structures 201 may be the fin structures in the pull-up (PU) transistors of the SRAM.

In other embodiments, the base substrate may be used to form semiconductor devices, and the semiconductor devices may be P-type metal-oxide-semiconductor (PMOS) transistors; or alternatively, the semiconductor devices may be N-type metal-oxide-semiconductor (NMOS) transistors.

In one embodiment, the semiconductor structure may further include a plurality of second fin structures 202 formed on the surface of the base substrate 200. Each second fin structure 202 may be located on the same side of both first fin structures 201, that is, the second fin structure 202 may not be formed in the first region I located between the two first fin structures 201. In other embodiments, the first region between the two first fin structures may contain one or more second fin structures.

In some embodiments, each of the plurality of second fin structures may be identical to the first fin structure. For illustrative purposes, two first fin structures are selected from a plurality of identical fin structures to illustrate the method for fabricating a semiconductor structure in a region containing the plurality of fin structures. That is, a plurality of fin structures may be formed on the base substrate, and among them, two fin structures are described to illustrate the fabrication process for the region containing the two fin structures, and the same or similar fabrication process may be applicable to any region containing two fin structures.

In one embodiment, the method for forming the base substrate 200, the first fin structures 201, and the second fin structures 202 may include the following exemplary steps. First, an initial base substrate may be provided. A first mask layer (not shown) may be formed on the surface of the initial base substrate. The first mask layer may expose a portion of the top surface of the initial base substrate. Further, the initial base substrate may be etched using the first mask layer as an etch mask to form the base substrate 200, the two first fin structures 201, and the plurality of second fin structures 202.

In one embodiment, the initial base substrate may be made of silicon, and accordingly, the base substrate 200, the first fin structures 201, and the second fin structures 202 may also be made of silicon.

In other embodiments, the initial base substrate may be made of a material including germanium, silicon germanium, silicon on insulator (SOI), germanium on insulator (GOI), silicon germanium on insulator (SGOI), or any other appropriate semiconductor material or composite structure. Accordingly, the base substrate, the first fin structures, the second fin structures may also be made of a material including germanium, silicon germanium, SOI, GOI, SGOI, or any other appropriate semiconductor material or composite structure.

In one embodiment, the first mask layer may be made of a material including silicon nitride or titanium nitride. Etching the initial base substrate using the first mask layer as the etch mask may include a dry etching process, a wet etching process, or a process combining dry etching and wet etching.

In one embodiment, an initial isolation structure 203 may be formed on the surface of the base substrate 200. The top surface of the initial isolation structure 203 may be lower than the top surfaces of the first fin structures 201 and the second fin structures 202. In addition, the initial isolation structure 203 may cover a portion of the sidewall surfaces of each first fin structure 201 and also cover a portion of the sidewall surfaces of each second fin structure 202.

In one embodiment, prior to forming the initial isolation structure 203, the fabrication method may further include forming an oxide layer 230 on the surface of the base substrate 200, the top and the sidewall surfaces of each first fin structure 201, and the top and the sidewall surfaces of each second fin structure 202.

The oxide layer 230 may be made of a material including silicon oxide. The process for forming the oxide layer 230 may include in-situ steam generation. The oxide layer 230 formed through the in-situ steam generation process may be sufficiently dense such that the removal rate of the oxide layer 230 in a subsequent process may be less than the removal rate of the initial isolation structure 203. As such, forming the oxide layer 230 through the in-situ steam generation process may be conducive to ensuring that a remaining portion of the oxide layer 230 covers the sidewall surfaces of each first fin structure 201. The portion of the oxide layer 230 covering the sidewall surfaces of the first fin structure 201 may be subsequently used to limit (e.g., define) the topography of the first source/drain doped region.

The fabrication method for the initial isolation structure 203 may include forming an isolation material film on the surface of the oxide layer 230, and removing a portion of the isolation material film to form the initial isolation structure 203.

In one embodiment, the isolation material film may be made of a material including silicon oxide or silicon oxynitride. Accordingly, the initial isolation structure 203 may be made of a material including silicon oxide or silicon oxynitride. The process for forming the isolation material film may include chemical vapor deposition (CVD) or physical vapor deposition (PVD).

During the formation of the isolation material film, the oxide layer 230 may be used to protect the surface of the base substrate 200, the top and the sidewall surfaces of each first fin structure 201, and the top and the sidewall surfaces of each second fin structures 202, and thus prevent the base substrate 200, the top and the sidewall surfaces of the first fin structure 201, and the top and the sidewall surfaces of the second fin structure 202 from being damaged.

Removing the portion of the isolation material film may include a dry etching process, a wet etching process, or a process combining dry etching and wet etching.

During the process of removing the portion of the isolation material film, the oxide layer 230 on the top surface and a portion of the sidewall surfaces of each first fin structure 201 as well as on the top surface and a portion of the sidewall surfaces of each second fin structure 202 may be removed to expose the top surface and the portion of the sidewall surfaces of the first fin structure 201 as well as the top surface and the portion of the sidewall surfaces of the second fin structure 202.

The initial isolation structure 203 may be used to electrically isolate different semiconductor devices.

Figure 5:
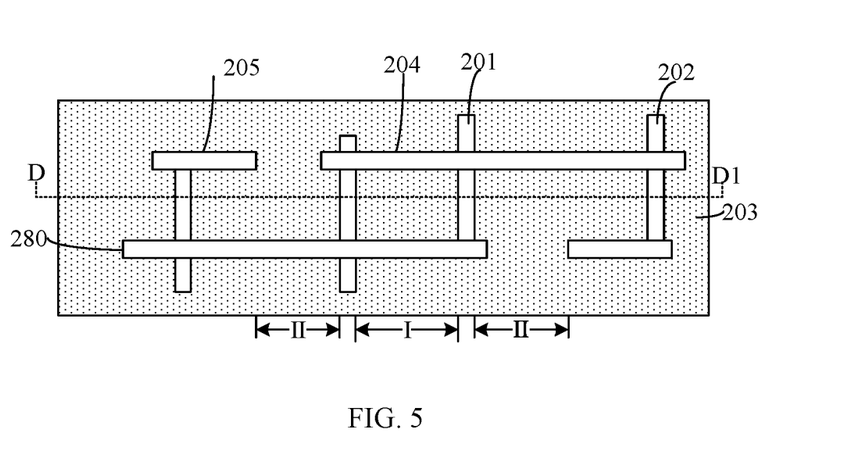
Figure 6:
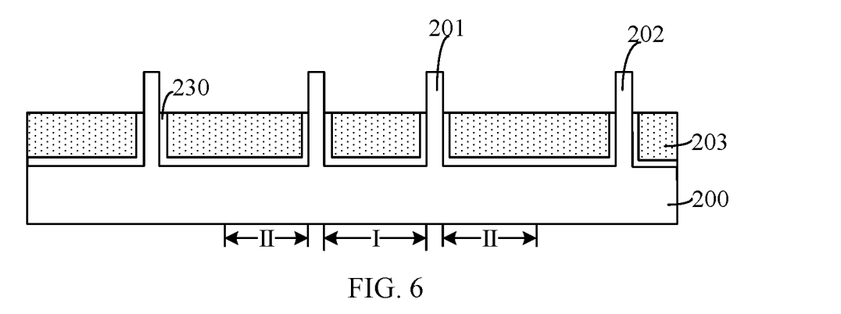

Further, returning to FIG. 12, a plurality of first gate structures may be formed across the first fin structures, and a plurality of second gate structures and a plurality of third gate structures may be formed across the second fin structures (S402). FIGS. 5-6 illustrate schematic views of a semiconductor structure consistent with various embodiments of the present disclosure. Specifically, FIG. 5 illustrates a schematic top view of the semiconductor structure, and FIG. 6 illustrates a schematic cross-sectional view of the structure shown in FIG. 5 along a D-D1 line. The direction of the cross-sectional view shown in FIG. 6 is consistent with the direction of the cross-sectional view shown in FIG. 3.

Referring to FIGS. 5-6, a plurality of first gate structures 204 may be formed across the two first fin structures 201, and a plurality of second gate structures 205 and a plurality of third gate structures 208 may be formed across the plurality of second fin structures 202.

In one embodiment, the plurality of first gate structures 204, the plurality of second gate structures 205, and the plurality of third gate structures 208 may be simultaneously formed. In other embodiments, the plurality of first gate structures may be formed before forming the plurality of second gate structures and the plurality of third gate structures. Alternatively, the plurality of first gate structures may be formed after forming the plurality of second gate structures and the plurality of third gate structures.

In one embodiment, the process for forming the plurality of first gate structures 204, the plurality of second gate structures 205, and the plurality of third gate structures 208 may include the following exemplary steps. A gate dielectric layer may be formed on the top and the sidewall surfaces of each first fin structure 201, the top and the sidewall surfaces of each second fin structure 202. A gate electrode layer may be formed on the surface of the gate dielectric layer. A second mask layer may be formed on the surface of the gate electrode layer. The second mask layer may expose a portion of the top surface of the gate electrode layer. The gate electrode layer and the gate dielectric layer may then be etched using the second mask layer as an etch mask to form the plurality of first gate structures 204 across the first fin structures 201, the plurality of second gate structures 205 and the plurality of third gate structures 208 across the second fin structures 202.

In one embodiment, the gate dielectric layer may be made of a material including silicon oxide. The process for forming the gate dielectric layer may include CVD, PVD, or atomic layer deposition (ALD).

In one embodiment, the gate electrode layer may be made of a material including silicon. The process for forming the gate electrode layer may include CVD, PVD, or ALD.

In one embodiment, the second mask layer may be made of a material including silicon nitride or titanium nitride. The second mask layer may be used as the mask for forming the plurality of first gate structures 204 and the plurality of second gate structures 205.

In one embodiment, etching the gate electrode layer using the second mask layer as the etch mask may include a dry etching process, a wet etching process, or a process combining dry etching and wet etching.

In one embodiment, etching the gate dielectric layer using the second mask layer as the etch mask may include a dry etching process, a wet etching process, or a process combining dry etching and wet etching.

Figure 7:
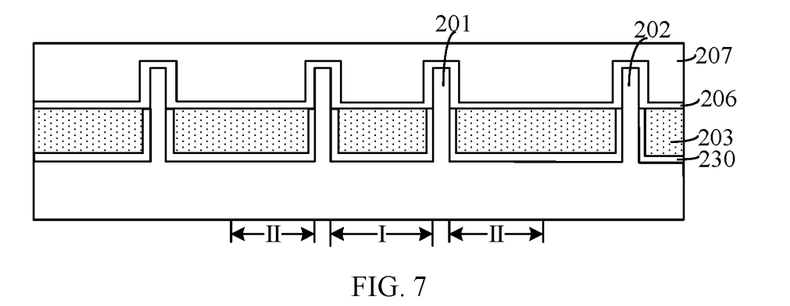

Further, returning to FIG. 12, a sidewall film may be formed on the sidewall and the top surfaces of each first fin structure, the sidewall and the top surfaces of each second fin structure, the sidewall and the top surfaces of each first gate structure, the sidewall and the top surfaces of each second gate structure, and the sidewall and the top surfaces of each third gate structure, and a photoresist material film may be formed on the surface of the sidewall film (S403). FIG. 7 illustrates a schematic view of a semiconductor structure consistent with various embodiments of the present disclosure. The direction of the cross-sectional view shown in FIG. 7 is consistent with the direction of the cross-sectional view shown in FIG. 6.

Referring to FIG. 7, a sidewall film 206 may be formed on the sidewall and the top surfaces of each first fin structure 201, the sidewall and the top surfaces of each second fin structure 202, the sidewall and the top surfaces of each first gate structure 204, the sidewall and the top surfaces of each second gate structure 205, and the sidewall and the top surfaces of each third gate structure 208. Moreover, a photoresist material film 207 may be formed on the surface of the sidewall film 206.

In one embodiment, the sidewall film 206 may be made of a material including silicon nitride or silicon oxynitride. The process for forming the sidewall film 206 may include CVD, PVD, or ALD.

Figure 8:
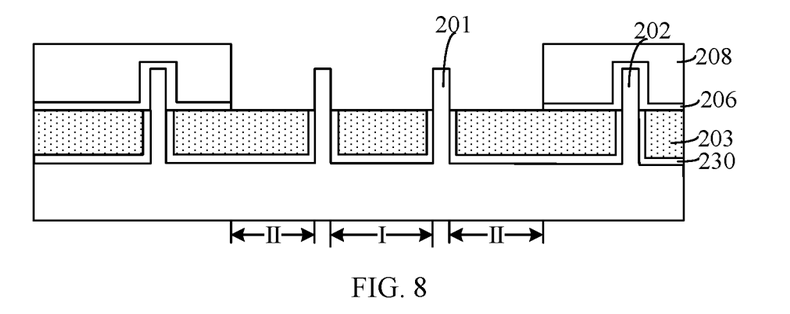

Further, returning to FIG. 12, the portion of the photoresist material film formed in the first region and the two second regions may be removed to expose the sidewall film and thus form a photoresist layer on the isolation structure on the two sides of the first region and the two second regions; after forming the photoresist layer, the portion of the sidewall film formed on the top and the sidewall surfaces of the first fin structures and on the top surface of the exposed portion of the isolation structure may be removed (S404). FIG. 8 illustrates a schematic cross-sectional view of a semiconductor structure consistent with some embodiments of the present disclosure.

Referring to FIG. 8, the portion of the photoresist material film 207 (referring to FIG. 7) formed in the first region I and the two second regions II may be removed to expose the sidewall film 206. As such, a photoresist layer 208 may be formed on the surface of the initial isolation structure 203 on the two sides of the first region I and the two second regions II. After forming the photoresist layer 208, the portion of the sidewall film 206 formed on the top and the sidewall surfaces of the first fin structures 201 and on the top surface of the exposed portion of the initial isolation structure 203 may be removed.

Removing the portion of the sidewall film 206 on the top and the sidewall surfaces of the first fin structures 201 and on the top surface of the exposed portion of the initial isolation structure 203 may include a dry etching process, a wet etching process, or a process combining dry etching and wet etching.

Figure 9:
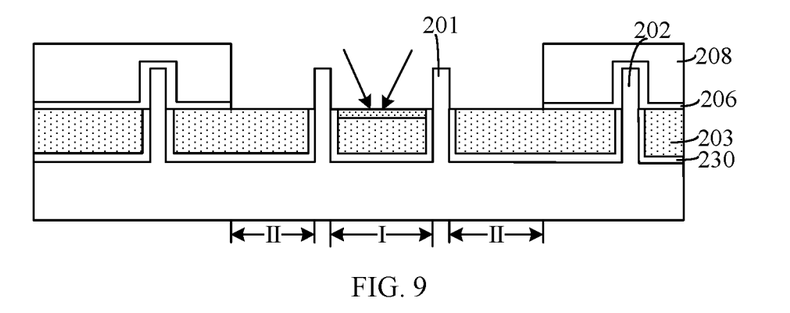

Further, returning to FIG. 12, after removing the portion of the sidewall film on the top and the sidewall surfaces of the first fin structures and on the top surface of the isolation structure, doping ions may be implanted into the top of the isolation structure in the first region adjacent to the first fin structures using the photoresist layer and the first fin structures as a mask (S405). FIG. 9 illustrates a schematic diagram of performing an ion implantation process according to various embodiments of the present disclosure.

Referring to FIG. 9, after removing the portion of the sidewall film 206 on the top and the sidewall surfaces of the first fin structures 201 and on the top surface of the initial isolation structure 203, doping ions may be implanted into the top of the initial isolation structure 203 in the first region I adjacent to the first fin structures 201 using the photoresist layer 208 and the first fin structures 201 as a mask.

In one embodiment, the photoresist layer 208 and the two first fin structures 201 may be used as the mask when implanting doping ions into the top of the initial isolation structure 203 in the first region I.

In one embodiment, implanting doping ions into the top of the initial isolation structure 203 in the first region I using the photoresist layer 208 and the two first fin structures 201 as the mask may include an ion implantation process.

In other embodiments, implanting doping ions into the top of the initial isolation structure in the first region using the photoresist layer and the two first fin structures as the mask may include the following exemplary steps. Forming a doped layer on the top of the initial isolation structure in the first region. The doped layer may contain a plurality of doping ions. Further, an annealing process may be performed such that the doping ions may enter the initial isolation structure.

In one embodiment, an ion implantation process is performed to implant doping ions into the top of the initial isolation structure 203 in the first region I. The doping ions may include nitrogen ions, boron ions, or fluoride ions. In one embodiment, the process parameters adopted in the ion implantation process may include using nitrogen ions as the doping ions, a doping dose in a range of approximately 5E13 atom/cm$^2$ to 1E15 atom/cm$^2$, a doping energy in a range of approximately 0 to 5 keV, and an implantation angle in a range of approximately 15° to 30°.

In one embodiment, the doping dose of the doping ions may be selected to be in a range of approximately 5E13 atom/cm$^2$ to 1E15 atom/cm$^2$ due to the following reasons. When the doping dose of the doping ions is smaller than 5E13 atom/cm$^2$, the subsequent removal rate of the initial isolation structure 203 in the first region I adjacent to the first fin structures 201 may still be too large, and thus the height that the subsequently-formed isolation structure in the first region I adjacent to the first fin structures 201 exceeds the bottom of the plurality of source/drain openings may be too small. As such, when using the isolation structure as a mask to form a plurality of first source/drain doped regions in the plurality of source/drain openings, the isolation structure formed in the first region I adjacent to the first fin structures 201 may not be able to effectively limit the topography of the first source/drain doped regions, and thus adjacent first source/drain doped regions may still likely contact each other. When the doping dose of the doping ions is larger than 1E15 atom/cm$^2$, the subsequent removal rate of the initial isolation structure 203 in the first region I adjacent to the first fin structures 201 may be too small, so that the height that the subsequently-formed isolation structure in the first region I adjacent to the first fin structures 201 exceeds the bottom of the plurality of source/drain openings may be too large. As such, when using the isolation structure as a mask to form a plurality of first source/drain doped regions in the plurality of source/drain openings, the isolation structure formed in the first region I adjacent to the first fin structures 201 may be able to strictly limit (e.g., define) the topography of the first source/drain doped regions, and thus in the first region I, the dimension of each first source/drain doped region along the width direction of the first fin structure 201 may be too small. Therefore, after a plug is subsequently formed on the top of the first source/drain doped region, the contact area between the plug and the first source/drain doped region may be too small, such that the contact resistance between the plug and the first source/drain doped region may be too large, which may not be conducive to improving the performance of the semiconductor device.

In one embodiment, the implantation angle may be selected to be in a range of approximately 15° to 30° due to the following reasons. When the implantation angle is smaller than 15°, the doping ions may also be implanted into the top of the initial isolation structure 203 in the second region II adjacent to the first fin structures 201, and thus the subsequently-formed isolation structure in the second region II adjacent to the first fin structures 201 may be able to strictly limit (e.g., define) the topography of the first source/drain doped regions. As such, the dimension of each first source/drain doped region along the width direction of the first fin structure may be too small. Therefore, after a plug is subsequently formed on the top of the first source/drain doped region, the contact area between the plug and the first source/drain doped region may be too small, such that the contact resistance between the plug and the first source/drain doped region may be too large. When the implantation angle is larger than 30°, the amount of doping ions implanted into the initial isolation structure 203 formed in the first region I adjacent to the first fin structures 201 may be too small, so that the removal rate of the initial isolation structure 203 formed in the first region I adjacent to the first fin structures 201 may still be too large. As such, the isolation structure formed in the first region I adjacent to the first fin structures 201 may not be able to effectively limit (e.g., define) the topography of the first source/drain doped regions, and thus adjacent first source/drain doped regions may still likely contact each other.

The doping ions may cause the removal rate of the portion of the initial isolation structure 203 formed in the first region I adjacent to the first fin structures 201 becoming smaller than the removal rate of the portion of the initial isolation structure 203 in the second region II adjacent to the first fin structures 201, and thus the top surface of the subsequently-formed isolation structure in the first region I adjacent to the first fin structures 201 may be higher than the top surface of the subsequently-formed isolation structure in the second region II adjacent to the first fin structures 201. With a large height (e.g., thickness), the portion of the isolation structure formed in the first region I adjacent to the first fin structures 201 may be able to strictly limit (e.g., define) the subsequently-formed first source/drain doped regions. Therefore, the dimension of the first source/drain doped region along the width direction of the first fin structures 201 may be small, so that adjacent first source/drain doped regions may unlikely contact each other. In the meantime, the height (e.g., thickness) of the portion of the isolation structure formed in the second region II adjacent to the first fin structures 201 may be small, so that the isolation structure formed in the second region II adjacent to the first fin structures 201 may not be able to strictly limit (e.g., define) the topography of the first source/drain doped regions. Therefore, in the second region II, the dimension of the formed first source/drain doped region along the width direction of the first fin structure 201 may not be too small. As such, after a plug is subsequently formed on the top of the first source/drain doped region, the contact area between the plug and the first source/drain doped region may be sufficiently large, which may be conducive to reducing the contact resistance between the plug and the first source/drain doped region.

Further, returning to FIG. 12, after implanting doping ions into the top of the initial isolation structure in the first region adjacent to the first fin structures, a plurality of initial source/drain openings, each with a bottom lower than the top of the initial isolation structure, may be formed in the first fin structure on both sides of each first gate structure, a portion of the initial isolation structure may then be removed to form an isolation structure, and the plurality of initial source/drain openings in the isolation structure may become a plurality of source/drain openings (S406). FIG. 10 illustrates a schematic cross-sectional view of a semiconductor structure consistent with some embodiments of the present disclosure.

Referring to FIG. 10, after implanting doping ions into the top of the initial isolation structure in the first region I adjacent to first fin structures 201, a plurality of initial source/drain openings (not shown) may be formed in the first fin structure 201 on both sides of each first gate structure 204 (referring to FIG. 5). The bottom surface of each first source/drain opening may be lower than the top surface of the initial isolation structure 203. After forming the plurality of initial source/drain openings, a portion of the initial isolation structure 203 may be removed to form an isolation structure 250. Because the removal rate of the portion of the initial isolation structure 203 formed in the first region I adjacent to the first fin structures 201 is smaller than the removal rate of the portion of the initial isolation structure 203 formed in the second region II adjacent to the first fin structures 201, the top surface of the isolation structure 250 formed in the first region I adjacent to the first fin structures 201 may be higher than the top surface of the isolation structure 250 formed in the second region II adjacent to the first fin structures 201. The plurality of initial source/drain openings located in the isolation structure 250 may become a plurality of source/drain openings 210.

The process for forming the plurality of initial source/drain openings may include a dry etching process, a wet etching process, or a process combining dry etching and wet etching. The process for removing a portion of the initial isolation structure 203 may include a dry etching process, a wet etching process, or a process combining dry etching and wet etching.

In one embodiment, the portion of the initial isolation structure 203 may be removed through a wet etching process. The etchant used in the wet etching process may be hydrofluoric acid solution.

During the process of removing the portion of the initial isolation structure 203, because the density of the oxide layer 230 is larger than the density of the initial isolation structure 203, a portion of the oxide layer 230 may remain on the sidewall surfaces of the first fin structures 201. The remaining portion of the oxide layer 230 may be used to limit (e.g., define) the topography of the first source/drain doped regions in a subsequent process.

Because the portion of the initial isolation structure 203 formed in the first region I adjacent to the first fin structures 201 contains doping ions, the removal rate of the portion of the initial isolation structure 203 formed in the first region I adjacent to the first fin structures 201 may be smaller than the removal rate of the portion of the initial isolation structure 203 formed in the second region II adjacent to the first fin structures 201. Therefore, the top surface of the portion of the isolation structure 250 formed in the first region I adjacent to the first fin structures 201 may be higher than the top surface of the portion of the isolation structure 250 formed in the second region II adjacent to the first fin structures 201.

For example, the height difference (e.g., vertical distance) between the top surface of the isolation structure 250 formed in the first region I adjacent to the first fin structures 201 and the top surface of the isolation structure 250 formed in the second region II adjacent to the first fin structures 201 may be in a range of approximately 1 nm to 5 nm.

The vertical distance from the top of the isolation structure 250 formed in the first region I adjacent to the first fin structures 201 to the bottom of the source/drain openings 210 may be in a range of approximately 2 nm to 4 nm. The vertical distance from the top of the isolation structure 250 formed in the second region II adjacent to the first fin structures 201 to the bottom of the source/drain openings 210 may be in a range of approximately 1 nm to 3 nm.

In a subsequent process, a plurality of first source/drain doped regions may be formed in the plurality of source/drain openings 210 using the isolation structure 250 as a mask. The plurality of first source/drain doped regions may also be partially formed in the first region I. Because the distance from the top of the isolation structure 250 formed in the first region I adjacent to the first fin structures 201 to the bottom of the source/drain openings 210 is large, the isolation structure 250 formed in the first region I adjacent to the first fin structures 201 may be able to strictly limit (e.g., define) the topography of the first source/drain doped regions. Therefore, in the first region I, the dimension of the first source/drain doped regions along the width direction of the first fin structure 201 may be small, so that adjacent first source/drain doped regions may unlikely contact each other. In the meantime, the plurality of first source/drain doped regions may also be partially formed in the first region I. Because the distance from the top of the isolation structure 250 formed in the second region II adjacent to the first fin structures 201 to the bottom of the source/drain openings 210 is small, the isolation structure 250 formed in the second region II adjacent to the first fin structures 201 may not be able to strictly limit (e.g., define) the topography of the first source/drain doped regions. Therefore, in the second region II, the dimension of the formed first source/drain doped region along the width direction of the first fin structure 201 may not be too small. As such, when a plug is subsequently formed on the top of the first source/drain doped region, the contact area between the plug and the first source/drain doped region may be sufficiently large. Therefore, the contact resistance between the plug and the first source/drain doped region may be small, which may be conducive to improving the performance of the semiconductor device.

In other embodiments, after forming the isolation structure, the plurality of source/drain openings may then be formed.

Further, returning to FIG. 12, a plurality of first source/drain doped regions may be formed in the plurality of source/drain openings using the isolation structure as a mask (S407). FIG. 11 illustrates a schematic cross-sectional view of a semiconductor structure consistent with various embodiments of the present disclosure.

Referring to FIG. 11, a plurality of first source/drain doped regions 211 may be formed in the plurality of source/drain openings 210 using the isolation structure 250 as a mask.

The plurality of first source/drain doped regions 211 may be formed through a method including the following exemplary steps. A first epitaxial layer may be formed in the plurality of source/drain openings 210. The first epitaxial layer may then be doped with first source/drain doping ions to form the plurality of first source/drain doped regions 211.

In one embodiment, the plurality of first fin structures 201 may be used as the fin structures of PU transistors. Because the PU transistors are PMOS transistors, the first epitaxial layer may be made of a material including silicon germanium or silicon, and the first source/drain doping ions may be P-type ions, such as B ions.

In other embodiments, the plurality of first fin structures may be used as the fin structures of PMOS transistors or the fin structures of NMOS transistors. When the plurality of first fin structures are used as the fin structures of PMOS transistors, the first epitaxial layer may be made of a material including silicon germanium or silicon, and the first source/drain doping ions may be P-type ions, such as B ions. When the plurality of first fin structures are used as the fin structures of NMOS transistors, the first epitaxial layer may be made of a material including silicon carbide or silicon, and the first source/drain doping ions may be N-type ions, such as P ions, or As ions.

During the process for forming the plurality of first source/drain doped regions 211 in the source/drain openings 210 using the isolation structure 250 as the mask, because the distance from the top of the isolation structure 250 in the first region I adjacent to the first fin structures 201 to the bottom of the source/drain openings 210 (referring to FIG. 10) is large, the isolation structure 250 formed in the first region I may be able to strictly limit (e.g., define) the first source/drain doped regions 211. The first source/drain doped regions may be partially in the first region I. In the first region I, because the isolation structure 250 formed in the first region I strictly limits (e.g., defines) the topography of the first source/drain doped regions 211, the dimension of each first source/drain doped region along the width direction of the first fin structure 201 may still be small, so that adjacent first source/drain doped regions 211 may be unlikely contact each other. The first source/drain doped regions 211 may also be partially formed in the second region II. Because the distance from the top of the isolation structure 250 formed in the second region II adjacent to the first fin structures 201 to the bottom of the first source/drain openings 210 (referring to FIG. 10) is small, the isolation structure 250 formed in the second region II adjacent to the first fin structures 201 may not be able to strictly limit (e.g., define) the topography of the first source/drain doped regions 211. Therefore, in the second region II, the dimension of the formed first source/drain doped region 211 along the width direction of the first fin structure 201 may not be too small. As such, when a plug is subsequently formed on the top of the first source/drain doped region 211, the contact area between the plug and the first source/drain doped region 211 may be sufficiently large, which may be conducive to reducing the contact resistance between the plug and the first source/drain doped region 211, and thus may improve the performance of the semiconductor device.

In one embodiment, after forming the plurality of first source/drain doped regions 211, the fabrication method may further include the following exemplary steps. The photoresist layer 208 may be removed. A plurality of second source/drain doped regions may be formed in the second fin structure 202 on both sides of each second gate structure 205. A plurality of third source/drain doped regions may be formed in the second fin structure 202 on both sides of each third gate structure 208. A dielectric layer may be formed on the surfaces of the isolation structure 250, the plurality of first source/drain doped regions 211, the plurality of second source/drain doped regions, and the plurality of third source/drain doped regions. The dielectric layer may also be formed on the sidewall and the top surfaces of the first gate structures 204, the sidewall and the top surfaces of the second gate structures 205, as well as the sidewall and the top surfaces of the third gate structures 208. A portion of the dielectric layer may then be removed until the top surfaces of the first source/drain doped regions 211, the second source/drain doped regions, and the third source/drain doped regions are exposed. As such, a plurality of contact holes may be formed in the dielectric layer. Further, a plug may be formed in each contact hole. The plug may filled up the contact hole.

The semiconductor structure may further include a plurality of PG transistors and a plurality of PD transistors. The plurality of PG transistors of the semiconductor structure may include the second fin structures 202 formed on the surface of the base substrate 200 on the two sides of the PU transistor, the second gate structures 205 formed across the second fin structures 202, and the second source/drain doped regions formed in the second fin structure 202 on both sides of each second gate structure 205. The plurality of PD transistors of the semiconductor structure may include the second fin structures 202, the third gate structures 280 formed across the second fin structures 202, and the third source/drain doped regions formed in the second fin structures 202 on both sides of each third gate structure 208.

In one embodiment, the semiconductor structure may be an SRAM including two PG transistors, two PU transistors, and two PD transistors.

In other embodiments, after forming the plurality of first source/drain doped regions, the fabrication method may further include the following exemplary steps. A dielectric layer may be formed on the surfaces of the isolation structure and the plurality of first source/drain doped regions, and also on the top and the sidewall surfaces of each first gate structure. A portion of the dielectric layer may be removed until the top surfaces of the first source/drain doped regions are exposed. As such, a plurality of contact holes may be formed in the dielectric layer. Further, a plug may be formed in each contact hole. The plug may fill up the contact hole.

Accordingly, the present disclosure also provides a semiconductor structure. FIG. 10 illustrates a schematic cross-sectional view of an exemplary semiconductor structure consistent with various embodiments of the present disclosure.

Referring to FIG. 10, the semiconductor structure may include a base substrate 200, and two first fin structures 201 arranged parallel to each other and on the base substrate 200.

The semiconductor structure may also include an isolation structure 250 formed on the surface of the base substrate 200. The top surface of the isolation structure 250 may be lower than the top surfaces of the two first fin structures 201. The isolation structure 250 may cover a portion of the sidewall surfaces of each first fin structure 201. The isolation structure 250 may include a first region I and two second regions II. The first region I may be in contact with both first fin structures 201, and thus may be located between the two first fin structures 201. Each second region II may be in contact with a first fin structure 201 and located on the side of the first fin structure 201 in opposite to the first region I. The top surface of the portion of the isolation structure 250 in the first region I adjacent to the first fin structures 201 may be higher than the top surface of the portion of the isolation structure 250 in the second region II.

The semiconductor structure may also include a plurality of source/drain openings 210 formed in the first fin structures 201. The bottom surface of the plurality of source/drain openings 210 may be lower than the top surface of the portion of the isolation structure 250 in the second region II.

In one embodiment, the height difference (e.g., vertical distance) between the top surface of the isolation structure 250 formed in the first region I adjacent to the first fin structures 201 and the top surface of the isolation structure 250 formed in the second region II adjacent to the first fin structures 201 may be in a range of approximately 1 nm to 5 nm. The vertical distance from the top of the isolation structure 250 formed in the first region I adjacent to the first fin structures 201 to the bottom of the source/drain openings 210 may be in a range of approximately 2 nm to 4 nm. The vertical distance from the top of the isolation structure 250 formed in the second region II adjacent to the first fin structures 201 to the bottom of the source/drain openings 210 may be in a range of approximately 1 nm to 3 nm.

The semiconductor structure may also include a first epitaxial layer formed in the plurality of source/drain openings 210. The first epitaxial layer may contain first source/drain doping ions.

The semiconductor structure may further include a plurality of PG transistors and a plurality of PD transistors. The plurality of PG transistors of the semiconductor structure may include the second fin structures 202 formed on the surface of the base substrate 200 on the two sides of the PU transistor, the second gate structures 205 formed across the second fin structures 202, and the second source/drain doped regions formed in the second fin structure 202 on both sides of each second gate structure 205. The plurality of PD transistors of the semiconductor structure may include the second fin structures 202, the third gate structures 280 formed across the second fin structures 202, and the third source/drain doped regions formed in the second fin structures 202 on both sides of each third gate structure 208.

In one embodiment, the semiconductor structure may be an SRAM including two PG transistors, two PU transistors, and two PD transistors.

In one embodiment, the first epitaxial layer may be partially located in the first region I and also partially located in the second region II. Along the width direction of the first fin structure 201, the dimension of the epitaxial layer formed in the first region I may be larger than the dimension of the epitaxial layer formed in the second region II.

Compared to exiting semiconductor structures and fabrication methods, the disclosed semiconductor structure and fabrication methods may have the following exemplary advantages.

According to the disclosed fabrication methods for semiconductor devices, doping ions are doped into the top of the initial isolation structure formed in the first region adjacent to the first fin structures. During a subsequent etching process using the first fin structures as an etch mask, the removal rate of the portion of the initial isolation structure formed in the first region adjacent to the first fin structures is smaller than the removal rate of the portion of the initial isolation structure formed in the second region adjacent to the first fin structures. As such, the top surface of the isolation structure formed in the first region adjacent to the first fin structures may be higher than the top surface of the isolation structure formed in the second region adjacent to the first fin structures. Further, a plurality of first source/drain doped regions may be subsequently formed in the plurality of source/drain openings using the isolation structure as a mask. Because the height of the portion of the isolation structure in the first region adjacent to the first fin structures is large, the isolation structure formed in the first region may be able to strictly limit (e.g., define) the topography of the first source/drain doped regions. As such, along the width direction of the first fin structure, the dimension of each first source/drain doped region may be small, so that adjacent first source/drain doped regions my unlikely contact each other. Because the height of the portion of the isolation structure in the second region adjacent to the first fin structures is small, the isolation structure formed in the second region may not be able to strictly limit (e.g., define) the topography of the first source/drain doped regions. As such, along the width direction of the first fin structure, the dimension of each first source/drain doped region may be sufficiently large. Therefore, after a plug is subsequently formed on the top of each first source/drain doped region, the contact area between the plug and the first source/drain doped region may not be too small, such that the contact resistance between the plug and the first source/drain doped region may be small, which may be conducive to improving the performance of the semiconductor device.

According to the disclosed methods for fabricating SRAMs, the first source/drain doped regions in adjacent PU transistors may unlikely contact each other, and along the width direction of the first fin structure, the dimension of the first source/drain doped regions may not be too small. After a plug is subsequently formed on the top of each first source/drain doped region, the contact area between the plug and the first source/drain doped region may not be too small, such that the contact resistance between the plug and the first source/drain doped region may be small, which may be conducive to improving the performance of the SRAM.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
providing a base substrate;
forming two first fin structures and an initial isolation structure on the base substrate, wherein the two first fin structures are parallel to each other, a top surface of the initial isolation structure is lower than top surfaces of the two first fin structures, the initial isolation structure includes a first region, located between the two first fin structures, and two second regions, each being in contact with a first fin structure and located on one side of the first fin structure in opposite to the first region;
implanting doping ions into a top of the initial isolation structure formed in the first region adjacent to the two first fin structures;
forming an isolation structure by removing a portion of the initial isolation structure, wherein a removal rate of the initial isolation structure formed in the first region adjacent to the two first fin structures is smaller than a removal rate of the initial isolation structure formed in the two second regions adjacent to the two first fin structures, and a top surface of the isolation structure formed in the first region adjacent to the two first fin structures is higher than the top surface of the isolation structure formed in the two second regions; and
forming a plurality of source/drain openings in the isolation structure by removing a portion of the two first fin structures.

2. The method according to claim 1, wherein:
a height difference between the top surface of the isolation structure formed in the first region adjacent to the two first fin structures and the top surface of the isolation structure formed in the two second regions adjacent to the two first fin structures is in a range of approximately 1 nm to 5 nm;
a vertical distance from the top surface of the isolation structure formed in the first region adjacent to the two first fin structures to a bottom surface of the plurality of source/drain openings is in a range of approximately 2 nm to 4 nm, and
a vertical distance from the top surface of the isolation structure formed in the second region adjacent to the two first fin structures to the bottom surface of the plurality of source/drain openings is in a range of approximately 1 nm to 3 nm.

3. The method according to claim 1, wherein:
the doping ions include nitrogen ions, boron ions, or fluoride ions.

4. The method according to claim 1, prior to implanting doping ions into the top of the initial isolation structure formed in the first region adjacent to the two first fin structures, further including:
forming a photoresist layer on the surface of the base substrate, wherein:
the photoresist layer exposes the surface of the base substrate in the first region and the two second regions and top and sidewall surfaces of the two first fin structures; and
implanting doping ions into the top of the initial isolation structure formed in the first region adjacent to the two first fin structures includes using the photoresist layer and the two first fin structures as a mask to implant doping ions into the top of the initial isolation structure formed in the first region adjacent to the two first fin structures.

5. The method according to claim 4, wherein using the photoresist layer and the two first fin structures as the mask to implant doping ions into the top of the initial isolation structure formed in the first region adjacent to the two first fin structures includes:
performing an ion implantation process, wherein parameters used in the ion implantation process include:
nitrogen ions as doping ions;

a doping dose in a range of approximately 5E13 atom/cm² to 1E15 atom/cm²;

a doping energy in a range of approximately 0 to 5 keV; and an implantation angle in a range of approximately 15° to 30°.

6. The method according to claim 4, wherein using the photoresist layer and the two first fin structures as the mask to implant doping ions into the top of the initial isolation structure formed in the first region adjacent to the two first fin structures includes:

forming a doped layer containing the doping ions on the top of the initial isolation structure in the first region; and performing an annealing process to drive the doping ions into the initial isolation structure.

7. The method according to claim 1, wherein forming the isolation structure and the plurality of source/drain openings includes:

removing the portion of the two first fin structures to form a plurality of initial source/drain openings in the initial isolation structure;

removing a portion of the initial isolation structure to form the isolation structure, wherein:

the plurality of initial source/drain openings located in the isolation structure become the plurality of source/drain openings.

8. The method according to claim 1, wherein:

the plurality of source/drain openings are formed after forming the isolation structure.

9. The method according to claim 1, after forming the plurality of source/drain openings, further including:

forming a first epitaxial layer in the plurality of source/drain openings using the isolation structure as a mask;

implanting first source/drain doping ions into the first epitaxial layer to form a plurality of first source/drain doped regions;

forming a dielectric layer on the surface of the base substrate, top and sidewall surfaces of the plurality of first source/drain doped regions, top and sidewall surfaces of the plurality of first gate structures;

forming a plurality of contact holes in the dielectric layer by removing a portion of the dielectric layer to expose the top surfaces of the plurality of first source/drain doped regions; and forming a plug in each contact hole, wherein the plug fills up the contact hole.

10. The method according to claim 9, wherein:

a portion of the first epitaxial layer is formed in the first region and another portion of the first epitaxial layer is formed in the two second regions; and along a width direction of the two first fin structures, a dimension of the first epitaxial layer formed in the first region is smaller than a dimension of the first epitaxial layer formed in the two second regions.

11. A method for forming a static random access memory (SRAM), comprising:

forming a plurality of pull-up (PU) transistors using a method according to claim 1.

12. The method according to claim 11, further including:

forming a plurality of pass-gate (PG) transistors and a plurality of pull-down (PD) transistors on the surface of the base substrate on both sides of each PU transistor, wherein:

the plurality of PG transistors include the plurality of second fin structures located on the surface of the base substrate on both sides of each PU transistor, a plurality of second gate structures formed across the plurality of second fin structures, and a plurality of second source/drain doped regions located in the plurality of second fin structures on both sides of each second gate structure;

the plurality of PD transistors include the plurality of second fin structures located on the surface of the base substrate on both sides of each PU transistor, a plurality of third gate structures formed across the plurality of second fin structures, and a plurality of third source/drain doped regions located in the plurality of second fin structures on both sides of each third gate structure.

13. The method according to claim 12, wherein:

a number of the plurality of PG transistors is 2;

a number of the plurality of PU transistors is 2; and a number of the plurality of PD transistors is 2.

* * * * *